(12) United States Patent
Takenaka

(10) Patent No.: US 7,012,277 B2
(45) Date of Patent: Mar. 14, 2006

(54) SEMICONDUCTOR LIGHT EMITTING DEVICE

(75) Inventor: Yasuji Takenaka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 31 days.

(21) Appl. No.: 10/745,764

(22) Filed: Dec. 23, 2003

(65) Prior Publication Data

US 2004/0135156 A1 Jul. 15, 2004

(30) Foreign Application Priority Data

Jan. 6, 2003 (JP) .............................. 2003-000216

(51) Int. Cl.
*H01L 29/26* (2006.01)
(52) U.S. Cl. .......................................... 257/79; 257/80
(58) Field of Classification Search ................. 257/79, 257/80, 81, 88, 93, 98
See application file for complete search history.

(56) References Cited

U.S. PATENT DOCUMENTS 6,335,548 B1 * 1/2002 Roberts et al. ............... 257/98
6,645,783 B1 * 11/2003 Brunner et al. .............. 438/26
2004/0070338 A1 4/2004 Noguchi et al.

FOREIGN PATENT DOCUMENTS

| JP | 11-046018 | 2/1999 |
|----|-----------|--------|
| JP | 2000-058924 | 2/2000 |
| JP | 2000-077725 | 3/2000 |
| JP | 2000-124566 | 4/2000 |
| JP | 2000-216443 | 8/2000 |
| JP | 2002-222998 | 8/2002 |
| JP | 2003-078219 | 3/2003 |

* cited by examiner

*Primary Examiner*—David Nelms
*Assistant Examiner*—Thinh T Nguyen
(74) *Attorney, Agent, or Firm*—Morrison & Foerster LLP

(57) ABSTRACT

A semiconductor light emitting device includes an LED chip, a first lead frame on which the LED chip is mounted, a second lead frame electrically connected to the LED chip via a bonding wire, and a resin portion surrounding the circumference of the LED chip, and fastening the first and second lead frames. A metal body is located under the region of the first lead frame where the LED chip is mounted.

9 Claims, 4 Drawing Sheets

SEMICONDUCTOR LIGHT EMITTING DEVICE

BACKGROUND OF THE INVENTION

1. Field of the Invention

The present invention relates to a semiconductor light emitting device and a fabrication method thereof. Particularly, the present invention relates to a semiconductor light emitting device employing a light emitting element such as a light emitting diode (LED), and a fabrication method thereof.

2. Description of the Background Art

An example of a conventional semiconductor light emitting device is shown in FIG. 8.

Referring to FIG. 8, a resin portion 3 is formed by insert-molding in a manner with a first lead frame 1 and a second lead frame 2 secured. An LED chip 4 is mounted on first lead frame 1 with Ag paste 7. A bonding wire 5 is attached to second lead frame 2. LED chip 4 is surrounded by epoxy resin 6 to be protected and sealed.

A fabrication method of the semiconductor light emitting device of FIG. 8 will be described hereinafter.

First and second lead frames 1 and 2 are formed in a predetermined pattern configuration, and embedded in resin portion 3 by insert-molding with the coat of bonding Ag applied. Then, LED chip 4 is mounted on first lead frame 1 with Ag paste 7. Bonding wire 5 is attached to second lead frame 2. Thus, electrical and mechanical connection of the lead frame is established. Sealing is provided by epoxy resin 6. Since the surface of the lead frame will be covered with rust to impede soldering if the surface is left with the Ag coat, an outer coat such as a solder coat is applied on the lead frame region. Then, unnecessary regions of the lead frame are cut away. The lead frame is bent to take the shape of a rigid-angle bent C form, and a terminal for junction with the mounting board is formed.

Heat is generated when light is emitted from the mounted LED chip. The generated amount of heat is proportional to the current flowing through the LED chip. The light emitting efficiency of the LED chip becomes lower as the temperature of the LED chip becomes higher, leading to degradation of light. In other words, brighter light cannot be effectively achieved even if a large current is conducted, and the lifetime of the LED chip will become shorter.

An LED chip exhibiting favorable light emitting efficiency even under high current and with favorable lifetime property can be provided by discharging the heat generated from the LED chip efficiently outside to reduce the temperature of the LED chip.

Such a conventional semiconductor light emitting device aimed to improve heat radiation efficiency is disclosed in, for example, Japanese Patent Laying-Open No. 11-46018 (Conventional Example 1), Japanese Patent Laying-Open No. 2002-222998 (Conventional Example 2), Japanese Patent Laying-Open No. 2000-58924 (Conventional Example 3), Japanese Patent Laying-Open No. 2000-77725 (Conventional Example 4), and Japanese Patent Laying-Open No. 2000-216443 (Conventional Example 5).

In Conventional Examples 1 and 2, heat radiation is improved by increasing the surface area of the lead frame. In Conventional Examples 3, 4 and 5, heat radiation is improved by using metal having thermal conductivity greater than that of resin for the substrate material.

However, increasing the surface area of the lead frame at the LED side by taking a nonlinear configuration for the lead frame or increasing the thickness as in Conventional Examples 1 and 2 is relatively limited by the restricted size of the package. The surface area of the lead frame cannot be increased sufficiently by just altering the configuration. Thus, the heat radiation efficiency could not be improved to a sufficient level.

Since the lead frame is to be bent at a subsequent step, the lead frame cannot be made too thick. Furthermore, a thicker lead frame will require greater force in punching out the lead frame from the sheet member, as compared to a thinner frame. Accordingly, the thickness of the mold must be increased to ensure the strength of the mold, leading to a wider gap of the punching part, i.e., between lead frames. Generally a gap equal to the thickness of the lead frame, or at least ¾ the thickness of the lead frame, is required. If the gap between lead frames is increased, sufficient area for bonding cannot be provided, or the frame area will become smaller.

Another approach related to heat radiation efficiency is to increase the contacting area between the lead frame terminal on the part of the LED element and the mounting board. Although this is advantageous from the standpoint of heat radiation, the heat during soldering will be easily conducted to the LED device to adversely affect the reliability.

In the case where metal having higher thermal conductivity than resin is employed for the substrate as in Conventional Examples 3, 4 and 5, there is a possibility of the heat during soldering adversely affecting the reliability of the LED device, likewise the above-described case.

SUMMARY OF THE INVENTION

In view of the foregoing, an object of the present invention is to provide a semiconductor light emitting device exhibiting high heat radiation and favorable light emitting efficiency and lifetime property without degrading the lead frame workability and the reliability of the LED chip, and a fabrication method thereof.

According to an aspect of the present invention, a semiconductor light emitting device includes an LED chip, a first lead frame on which the LED chip is mounted, a second lead frame electrically connected to the LED chip via a wire, and a resin portion surrounding the LED chip and securing the first and second lead frames. A metal body is located under the region of the first lead frame where the LED chip is mounted.

Accordingly, heat can be transmitted efficiently from the first lead frame to the metal body. Thus, a semiconductor light emitting device exhibiting superior heat radiation can be provided.

The metal body may be located apart from the first lead frame or brought into contact with the first lead frame. In both cases, electrical insulation of the lead frame is established.

In the case where the surface of the metal body is subjected to an electrical insulation process, the surface of the metal body subjected to the insulation process preferably forms contact with the first lead frame. Accordingly, heat radiation of the semiconductor light emitting device can be further improved.

The semiconductor light emitting device preferably includes a plurality of LED chips. Accordingly, the applicability to a product such as a full color display can be increased.

According to another aspect of the present invention, a semiconductor light emitting device includes an LED chip, a metal body on which the LED chip is mounted, a first lead frame electrically connected to the metal body, a second lead frame electrical connected to the LED chip via a wire, and a resin portion surrounding the metal body and the LED chip, and securing the first and second lead frames.

Accordingly, the heat generated at the LED chip is directly transmitted to the mounting board via the metal body. Thus, heat radiation is improved.

Preferably, the top portion of the metal body is formed in an upside down conical-frustum configuration, and the top portion is fitted in the first lead frame. Accordingly, the metal body is firmly secured to the lead frame. By the effect of reflection of the upside down conical-frustum configuration, the luminous intensity of the semiconductor light emitting device can be improved.

In the semiconductor light emitting device set forth above, the metal body preferably includes at least one material selected from the group consisting of copper, aluminum, copper alloy and aluminum alloy. These metals are advantageous in that the heat radiation of the semiconductor light emitting device can be improved by virtue of the high heat radiation.

According to an aspect of a fabrication method of a semiconductor light emitting device of the present invention, the fabrication method includes the steps of forming, by insert-molding, a resin portion holding a metal body and first and second lead frames, and mounting an LED chip on the metal body or first lead frame. Accordingly, the heat generated at the LED chip can be transmitted to the mounting board via the metal body located under the region of the first lead frame where the LED chip is mounted. A semiconductor light emitting device superior in heat radiation can be provided.

According to a still further aspect of the present invention, a fabrication method of a semiconductor light emitting device of the present invention includes the steps of forming, by insert-molding, a resin portion holding the first and second lead frames, and having a concave, attaching a metal body to the concave, and mounting an LED chip on the metal body or the first lead frame.

The fabrication method of a semiconductor light emitting device set forth above further includes the step of caulking the metal body and the first lead frame. Preferably, the top portion of the metal body is worked to an upside down conical-frustum configuration simultaneous to the caulking step. By the caulking step, the metal body and the first lead frame are secured more firmly. Also, the luminous intensity of the semiconductor light emitting device can be improved by the effect of the reflection of the upside down conical-frustum configuration.

According to the semiconductor light emitting device and fabrication method of the present invention, the heat generated at the LED chip can be discharged towards the mounting board via the metal body located under the region of the first lead frame where the LED chip is mounted. It is not necessary to use a thick lead frame. Therefore, degradation of the workability of the lead frame can be prevented. Furthermore, the heat during soldering will not be easily transmitted to the LED. Thus, a semiconductor light emitting device superior in heat radiation can be provided without degrading the workability of the lead frame and reliability of the LED chip.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6B shows a resin portion after insert-molding of the lead frame and metal body is completed.

FIG. 7B shows a resin portion after insert-molding of the lead frame, and FIG. 7C corresponds to the case where the metal body is inserted in the concave of the resin portion.

DESCRIPTION OF THE PREFERRED EMBODIMENTS

Embodiments of a semiconductor light emitting device and fabrication method thereof will be described hereinafter.

First, embodiments of the inventive semiconductor light emitting device will be described with reference to FIGS. 1–5.

In the first to fifth embodiments set forth below, the number of LED chips 4 mounted is preferably in plurality. Accordingly, applicability of the semiconductor light emitting device to a product such as a full color display can be increased. In the case where a plurality of LED chips are mounted in one product, heat radiation is critical due to the large heat generation. The present embodiment is particularly advantageous to overcome this problem.

First Embodiment

Figure 1:
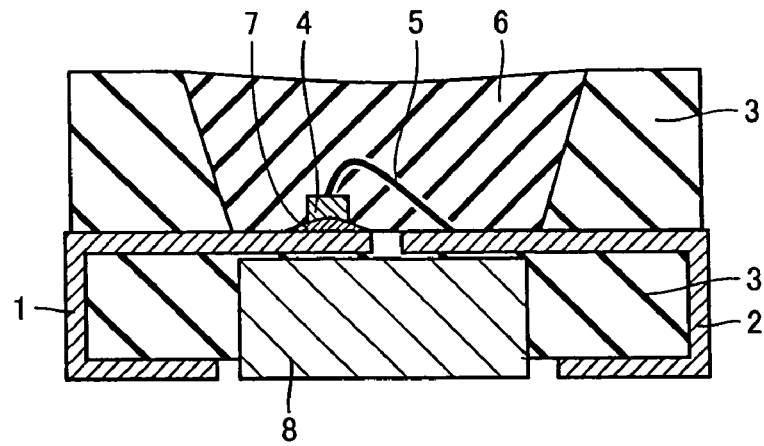
FIGS. 1–5 are sectional views of a surface mount type LED according to first, second, third, fourth, and fifth embodiments, respectively, of the present invention.

FIG. 1 is a sectional view of a surface mount type LED according to a first embodiment of the present invention.

The semiconductor light emitting device of the first embodiment includes an LED chip 4, a first lead frame 1 on which LED chip 4 is mounted, a second lead frame 2 electrically connected to LED chip 4 via a bonding wire 5 such as a gold wire, and a resin portion 3 surrounding the circumference of LED chip 4, and securing the lead frame. A metal body 8 is located under the region of first lead frame 1 where LED chip 4 is mounted.

First and second lead frames 1 and 2 are embedded in resin portion 3 by insert-molding. LED chip 4 is mounted on first lead frame 1 with Ag paste 7 therebetween. Bonding wire 5 is attached to second lead frame 2. Accordingly, second lead frame 2 is mechanically and electrically connected to LED chip 4. Resin portion 3 is formed so as to surround the circumference of LED chip 4, bonding wire 5, and Ag paste 7. The inner side surrounded by resin portion 3 is sealed with epoxy resin 6 to protect the LED element portion.

Metal body 8 is held by resin portion 3 functioning as a substrate. The lower portion of metal body 8 is exposed at resin portion 3 so as to be in close proximity to or formed in contact with the mounting board. Metal block 8 takes a block form, and is sandwiched between first and second lead frames 1 and 3 via resin portion 3.

In the first embodiment, metal body 8 is preferably located apart from first and second lead frames 1 and 2.

The reason why a gap is provided between first and second lead frames 1 and 2 and metal body 8 is to prevent the patterns of first and second lead frames 1 and 2 formed in separation from short-circuiting due to contact therebetween. In the first embodiment, the heat generated from LED chip 4 is sequentially transmitted through the first lead frame 1, the gap between first lead frame 1 and metal body 8, and then to metal body 8 to be discharged towards the mounting board. In order to efficiently transmit the heat generated at LED chip 4 to metal body 8, the aforementioned gap is preferably as small as possible. Also preferably, the volume of metal body 8 in the package is as large as possible in the package.

Preferably, metal body 8 includes at least one material selected from the group consisting of copper, aluminum, copper alloy and aluminum alloy. This is preferable from the standpoint of improving heat radiation due to the high heat radiation of these metal. The material of metal body 8 is not limited to those cited above, and other metal as well as a material other than metal such as ceramic may be used as long as it has a high heat radiation. It is to be noted that ceramic, though inferior in thermal conductivity than metal material, is insulative. Therefore, in the case where ceramic is employed, the ceramic body corresponding to metal body 8 can be brought into contact with first and second lead frames 1 and 2 without having to apply an insulation process on the surface.

Resin portion 3 located around LED chip 4 is formed of white resin having high reflectance for the purpose of reflecting efficiently the light emitted from LED chip 4. Furthermore, to promote output to the front side efficiently, the inner circumferential face is formed to take an upside down conical-frustum configuration. In the semiconductor light emitting device of the first embodiment, resin superior in heat resistance is employed for resin portion 3 since the semiconductor light emitting device is to be delivered to subsequent processing as a surface mount component. Specifically, liquid crystal polymer, polyamide type resin, and the like satisfying the above-described requirement is used. In the case where a large area of light emission is required, the inner circumferential face of resin portion 3 may take a configuration other than the upside down conical-frustum configuration, such as an upside down frustum configuration of a pyramid.

Epoxy resin 6 serves to protect the LED element portion. Epoxy resin 6 is transparent or lacteous, and is introduced mainly by potting. Alternatively, transfer-molding, injection-molding, and the like may be employed. In this case, the light emitting portion can take an arbitrary configuration (lens shape, or the like).

In the first embodiment, metal body 8 is located in the neighborhood of the center, when viewed in plane, of resin portion 3, and will not directly encounter the heat generated during the soldering step towards the mounting board. Thus, the heat generated during soldering will not degrade the reliability of the LED chip.

In view of the foregoing, the semiconductor light emitting device of the first embodiment is advantageous over conventional semiconductor light emitting devices in that heat radiation can be improved more easily.

Second Embodiment

Figure 2:
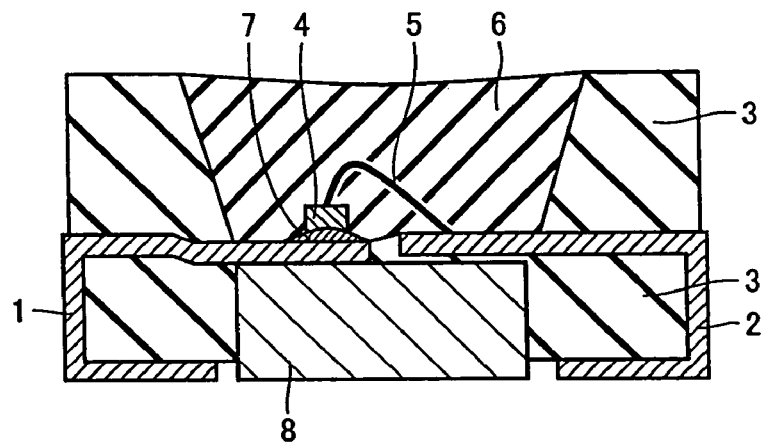

FIG. 2 is a sectional view of a surface mount type LED according to a second embodiment of the present invention.

The semiconductor light emitting device of the second embodiment is a modification of the semiconductor light emitting device of the first embodiment. Metal body 8 is brought into contact with first lead frame 1.

For example, first lead frame 1 on which LED chip 4 is mounted is set lower than second lead frame 2, whereby contact with metal body 8 is established. In the example shown in FIG. 2, first lead frame 1 is bent to form contact with metal body 8.

Accordingly, the heat generated from LED chip 4 is sequentially transmitted through first lead frame 1, metal body 8, and the mounting board. The gap between first lead frame 1 and metal body 8 seen in the first embodiment is absent, so that the heat generated at LED chip 4 can be transmitted to the mounting board more effectively. Although first lead frame 1 is bent down to form contact with metal body 8 in the present embodiment, a similar object can be effected by altering the shape of metal body 8 instead of modifying first lead frame 1. For example, a protrusion at the top plane of metal body 8 may be formed.

In view of the foregoing, the semiconductor light emitting device of the present embodiment can be improved in heat radiation as compared to the semiconductor light emitting device of the first embodiment.

Third Embodiment

Figure 3:
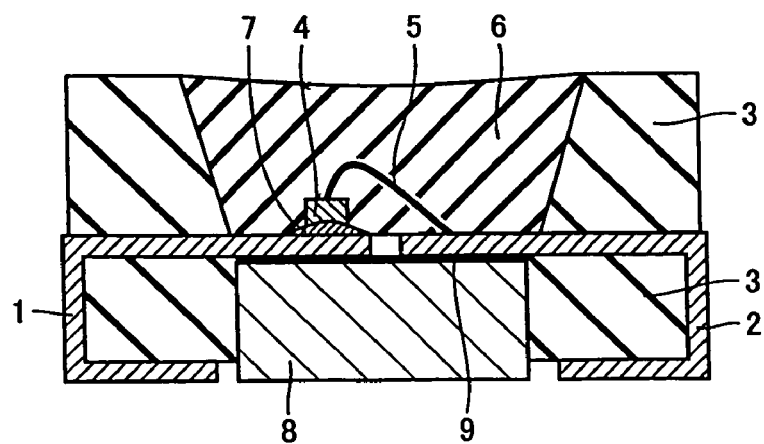

FIG. 3 is a sectional view of a surface mount type LED according to a third embodiment.

The semiconductor light emitting device of the third embodiment is another modification of the semiconductor light emitting device of the first embodiment. An electrical insulative processed portion 9 by, for example, applying an insulating film, an insulating coat, or by anodization, is provided at the surface of metal body 8. The surface of metal body 8 subjected to an insulating process forms contact with first and second lead frames 1 and 2.

In the semiconductor light emitting device of the second embodiment, the heat generated from LED chip 4, either in the case of a single LED chip or a plurality of LED chips, can be transmitted to the mounting board, absent of the portion corresponding to the gap between first lead frame 1 and metal body 8 as in the first embodiment, as long as the LED chips are located on the same lead frame.

In the case where a plurality of LED chips 4 are located on different lead frames, only one of the lead frames can be brought into contact with metal body 8 in order to prevent the patterns of respective lead frames formed in separation from short-circuiting. This means that a pattern portion restricted in heat radiation improvement will be present.

The third embodiment directed to the same object as the second embodiment is characterized in that short-circuiting will not occur even if the pattern of all lead frames is brought into contact with metal body 8 by virtue of the provision of an electrical insulative processed portion 9 at metal body 8. All the pattern portions can exhibit heat radiation efficiency.

The present third embodiment is advantageous in that heat radiation can be improved readily even when a plurality of LED chips 4 are located on different lead frames. The heat generated from LED chip 4 can be transmitted to the mounting board via the second lead frame 2, in addition to the transmitting route of first lead frame 1, metal body 8, and the mounting board.

Fourth Embodiment

Figure 4:
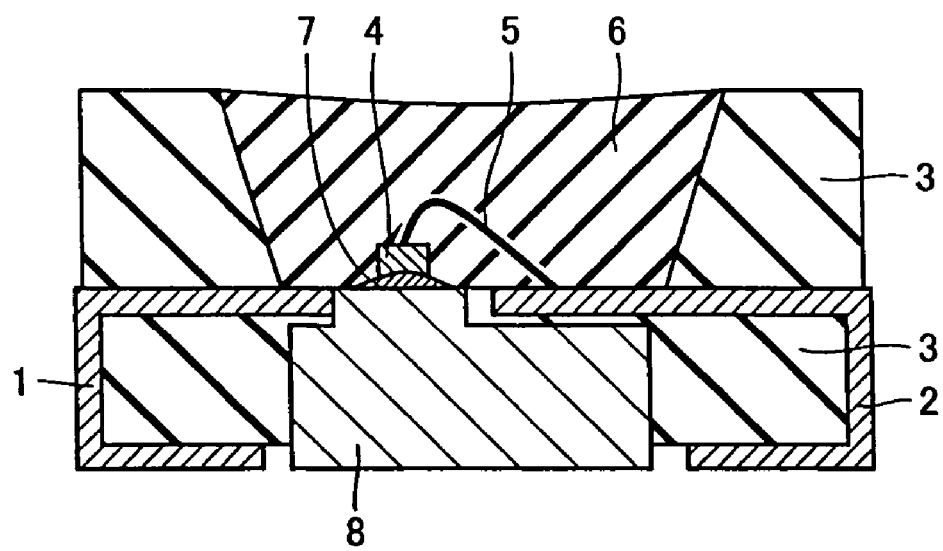

FIG. 4 is a sectional view of a surface mount type LED according to a fourth embodiment of the present invention.

The semiconductor light emitting device of the fourth embodiment includes an LED chip 4, a metal body 8 on which LED chip 4 is mounted, a first lead frame 1 electrically connected to metal body 8, a second lead frame 2 electrically connected to LED chip 4 via bonding wire 5, and a resin portion 3 surrounding the circumference of metal body 8 and LED chip 4, and fastening the first and second lead frames.

The fourth embodiment is characterized in that LED chip 4 is directly mounted on metal body 8. The heat generated from LED chip 4 is directly transmitted to metal body 8 to be transferred to the mounting board via metal body 8. Therefore, heat can be radiated more efficiently than in the first to third embodiments.

Fifth Embodiment

Figure 5:
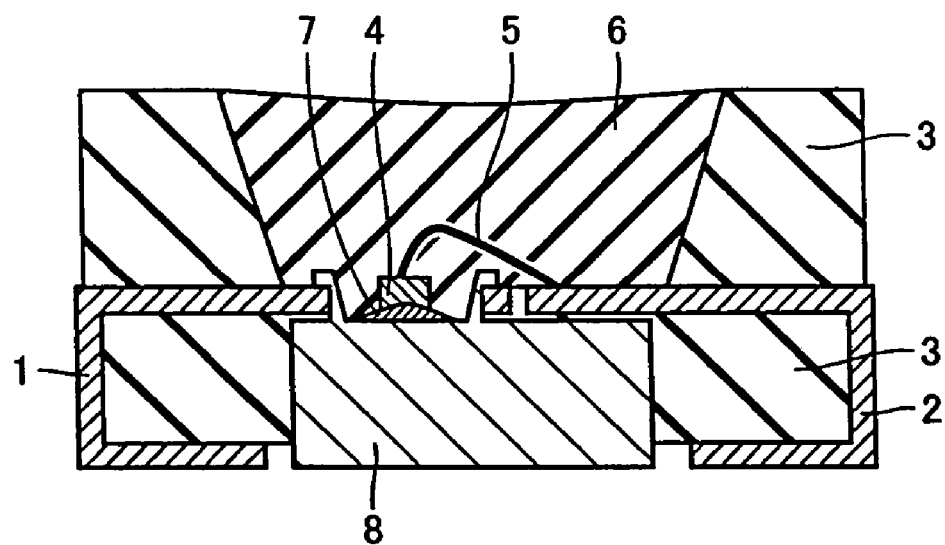

FIG. 5 is a sectional view of a surface mount type LED according to a fifth embodiment of the present invention.

In the fifth embodiment, the top portion of metal body 8 is formed to have an upside down conical-frustum configuration. The top portion of metal body 8 is fitted in first lead frame 1. Metal body 8 and first lead frame 1 are integrated as one piece by caulking. The top portion of metal body 8 is formed in an upside down conical-frustum configuration simultaneous to the caulking step. Accordingly, metal body 8 and first lead frame 1 are firmly secured. Furthermore, the luminous intensity of the semiconductor light emitting device can be increased by the reflection effect of the upside down conical-frustum configuration. The configuration of the top portion of metal body 8 is not limited to the aforementioned upside down conical-frustum configuration. For example, an upside down frustum configuration of a pyramid can be employed.

Sixth and seventh embodiments related to securing metal body 8 to resin portion 3 will be described with reference to FIGS. 6A and 6B and FIGS. 7A, 7B and 7C.

Sixth Embodiment

Figure 6A:
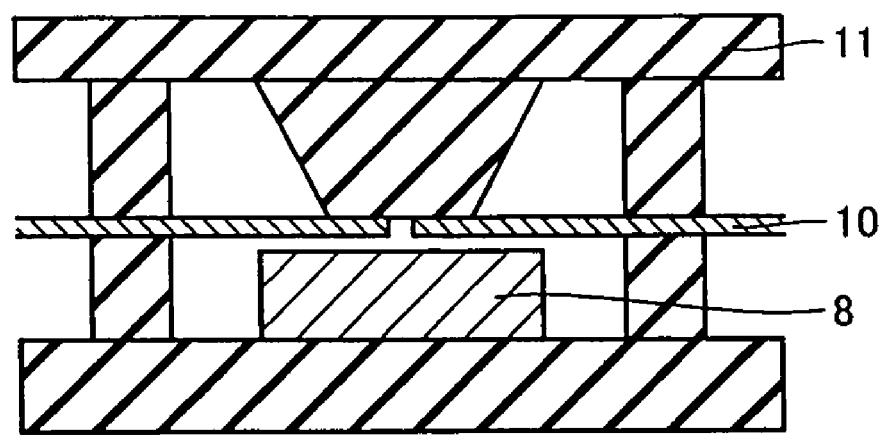
FIGS. 6A and 6B represent a fabrication method of a substrate on which an LED is mounted according to a sixth embodiment, wherein FIG. 6A corresponds to the case where the lead frame and metal body are set in an insert-molding die
Figure 6B:
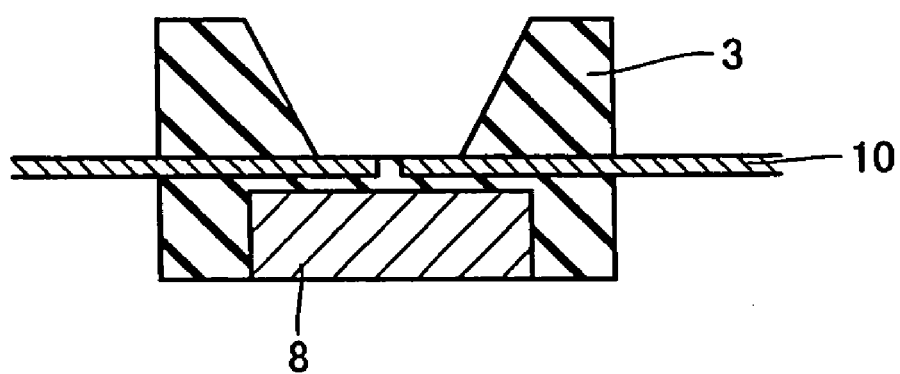

FIGS. 6A and 6B represent a fabrication method of a substrate on which an LED is mounted according to the sixth embodiment.

The fabrication method of the present sixth embodiment includes the step of forming, by insert molding, a resin portion 3 holding a metal body 8 and a lead frame 10, and the step of mounting an LED chip 4 on metal body 8 or lead frame 10. FIGS. 6A and 6B correspond to the case where LED chip 4 is mounted on lead frame 10.

As shown in FIG. 6A, lead frame 10 and metal body 8 are set substantially at the same time in an insert-molding die 11 for insert-molding. Accordingly, resin portion 3 is formed so as to integrate lead frame 10 with metal body 8, as shown in FIG. 6B. Then, LED chip 4 is mounted on one lead frame with Ag paste. LED chip 4 is connected to the other lead frame via a bonding wire.

Seventh Embodiment

Figure 7A:
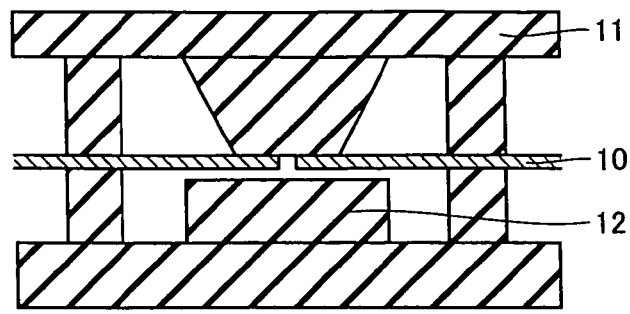
FIGS. 7A, 7B and 7C represent a fabrication method of a substrate on which an LED is mounted according to a seventh embodiment of the present invention, wherein FIG. 7A corresponds to the case where the lead frame is set in an insert-molding die.
Figure 7B:
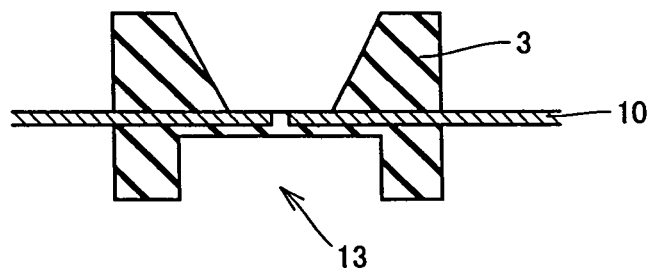
Figure 7C:
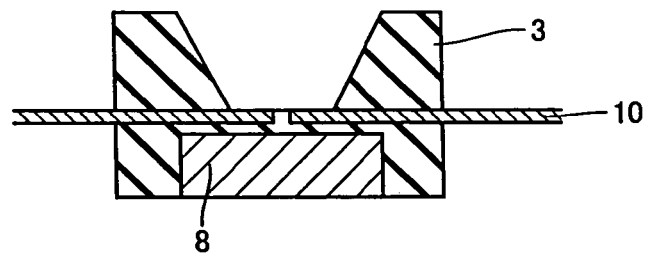
Figure 8:
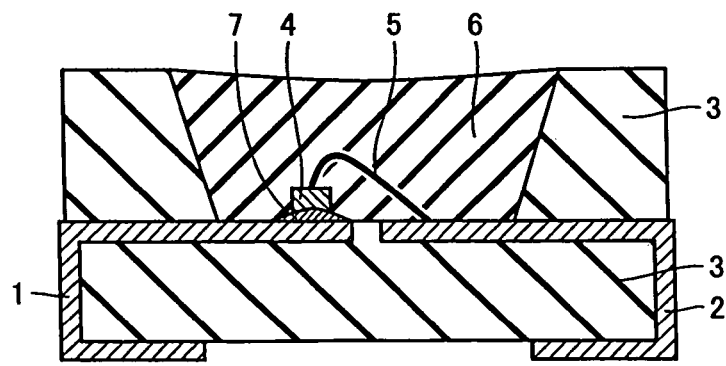
FIG. 8 is a sectional view of an example of a conventional semiconductor light emitting device.

FIGS. 7A, 7B and 7C represent a fabrication method of a substrate on which an LED is mounted according to a seventh embodiment of the present invention.

The fabrication method of the seventh embodiment includes the steps of forming resin portion 3 having a concave 13 by insert-molding so as to hold the frame 10, attaching metal body 8 to concave 13, and mounting LED chip 4 on metal body 8 or lead frame 10.

As shown in FIG. 7A, lead frame 10 is set in an insert-molding die 11 having a metal body insertion region formation die 12 for insert-molding. Accordingly, resin portion 3 holding lead frame 10 and having concave 13 can be formed as shown in FIG. 7B. Referring to FIG. 7C, metal body 8 is inserted into concave 13 in resin portion 3 subjected to the molding step set forth above, and firmly fixed using an adhesive or the like. Through a subsequent step similar to that of the sixth embodiment, LED chip 4 is mounted on one lead frame. LED chip 4 is connected to the other lead frame via bonding wire.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light emitting device comprising:
an LED chip,
a first lead frame on which said LED chip is mounted,
a second lead frame electrically connected to said LED chip via a wire, and
a resin portion surrounding a circumference of said LED chip, and fastening said first and second lead frames,
wherein a metal body is located under a region of said first lead frame where said LED chip is mounted, and
wherein the second lead frame has a portion where the wire is connected and the metal body is provided to extend to a region below said portion of the second lead frame.

2. The semiconductor light emitting device according to claim 1, wherein said metal body is spaced apart from said first and second lead frames.

3. The semiconductor light emitting device according to claim 1, wherein said metal body forms thermal and electrical contact with said first lead frame.

4. The semiconductor light emitting device according to claim 1, wherein
said metal body has a surface subjected to an electrical insulating process, and
said surface of said metal body subjected to said electrical insulating process forms physical contact with said first lead frame.

5. The semiconductor light emitting device according to claim 1, comprising a plurality of LED chips.

6. The semiconductor light emitting device according to claim 1, wherein said metal body includes at least one type of material selected from the group consisting of copper, aluminum, copper alloy, and aluminum alloy.

7. A semiconductor light emitting device comprising:
an LED chip,
a metal body on which said LED chip is mounted,
a first lead frame electrically connected to said metal body,
a second lead frame electrically connected to said LED chip via a wire, and
a resin portion surrounding a circumference of said metal body and said LED chip, and fastening said first and second lead frames, and
wherein the second lead frame has a portion where the wire is connected and the metal body is provided to extend to a region below said portion of the second lead frame.

8. A semiconductor light emitting device comprising:
an LED chip,
a metal body on which said LED chip is mounted,
a first lead frame electrically connected to said metal body,
a second lead frame electrically connected to said LED chip via a wire, and
a resin portion surrounding a circumference of said metal body and said LED chip, and fastening said first and second lead frames.
wherein
said metal body has a top portion worked in an upside down conical-frustum configuration, and
said top portion is fitted in said first lead frame.

9. The semiconductor light emitting device according to claim 7, wherein said metal body includes at least one type of material selected from the group consisting of copper, aluminum, copper alloy, and aluminum alloy.

* * * * *